United States Patent
Zhu et al.

(10) Patent No.: US 9,934,975 B2
(45) Date of Patent: Apr. 3, 2018

(54) N-TYPE MOSFET AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Qiuxia Xu, Beijing (CN); Yanbo Zhang, Beijing (CN); Hong Yang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/494,447

(22) Filed: Sep. 23, 2014

(65) Prior Publication Data

US 2015/0008537 A1    Jan. 8, 2015

Related U.S. Application Data

(63) Continuation of application No. PCT/CN2012/086127, filed on Dec. 7, 2012.

(30) Foreign Application Priority Data

Nov. 30, 2012    (CN) .......................... 2012 1 0505745

(51) Int. Cl.
*H01L 21/28*    (2006.01)
*H01L 29/66*    (2006.01)
(Continued)

(52) U.S. Cl.
CPC .. *H01L 21/28105* (2013.01); *H01L 21/28088* (2013.01); *H01L 21/28176* (2013.01);
(Continued)

(58) Field of Classification Search
CPC ......... H01L 21/28088; H01L 21/28105; H01L 21/28176; H01L 21/28185; H01L 29/4966;
(Continued)

(56) References Cited

U.S. PATENT DOCUMENTS 6,537,901 B2    3/2003    Cha et al.
6,589,866 B1    6/2003    Besser et al.
(Continued)

FOREIGN PATENT DOCUMENTS

CN    101661957 A    3/2010
CN    102110650 A    6/2011
(Continued)

OTHER PUBLICATIONS

International Search Report, PCT Application No. PCT/CN2012/086127, published Aug. 22, 2013.
(Continued)

*Primary Examiner* — Cuong Q Nguyen
*Assistant Examiner* — Tong-Ho Kim
(74) *Attorney, Agent, or Firm* — Knobbe Martens Olson & Bear LLP

(57) ABSTRACT

An N-type MOSFET and a method for manufacturing the same are disclosed. In one aspect, the method comprises forming source/drain regions in a semiconductor substrate. The method also includes forming an interfacial oxide layer on the semiconductor substrate. The method also includes forming a high-k gate dielectric layer on the interfacial oxide layer. The method also includes forming a first metal gate layer on the high-k gate dielectric layer. The method also includes implanting dopants into the first metal gate layer through conformal doping. The method also includes annealing a gate stack to change an effective work function
(Continued)

of the gate stack which includes the first metal gate layer, the high-k gate dielectric, and the interfacial oxide layer.

18 Claims, 7 Drawing Sheets

(51) Int. Cl.
*H01L 29/49* (2006.01)
*H01L 29/51* (2006.01)

(52) U.S. Cl.
CPC .... *H01L 21/28185* (2013.01); *H01L 29/4966* (2013.01); *H01L 29/513* (2013.01); *H01L 29/66537* (2013.01); *H01L 29/517* (2013.01); *H01L 29/518* (2013.01); *H01L 29/6653* (2013.01); *H01L 29/66545* (2013.01)

(58) Field of Classification Search
CPC ............. H01L 29/513; H01L 29/66537; H01L 29/66545
USPC .......................................... 257/407; 438/287
See application file for complete search history.

(56) References Cited

U.S. PATENT DOCUMENTS

| | | | |
|---|---|---|---|
| 2002/0123189 A1* | 9/2002 | Cha et al. | 438/228 |
| 2005/0095825 A1* | 5/2005 | Saito et al. | 438/527 |
| 2005/0136604 A1* | 6/2005 | Al-Bayati | H01J 37/321 |
| | | | 438/301 |
| 2008/0157228 A1* | 7/2008 | Chambers | H01L 21/28079 |
| | | | 257/407 |
| 2009/0053883 A1* | 2/2009 | Colombo | H01L 21/28079 |
| | | | 438/592 |
| 2010/0052066 A1 | 4/2010 | Yu et al. | |
| 2011/0027957 A1 | 2/2011 | Berry et al. | |
| 2011/0254093 A1* | 10/2011 | Wang et al. | 257/368 |
| 2011/0287620 A1* | 11/2011 | Xu et al. | 438/591 |
| 2012/0252197 A1* | 10/2012 | Clark | H01L 21/2254 |
| | | | 438/559 |
| 2012/0292715 A1 | 11/2012 | Hong et al. | |

FOREIGN PATENT DOCUMENTS

| | | |
|---|---|---|
| CN | 102254805 A | 11/2011 |
| CN | 102420192 A | 4/2012 |
| WO | WO 00/077828 A2 | 12/2000 |

OTHER PUBLICATIONS

Chinese Office Action dated Jan. 20, 2016 for Chinese Application No. 201210505745.4.

Chinese Office Action dated Jul. 21, 2016 for Chinese Application No. 201210505745.4 which corresponds in-priority to above-identified subject U.S. application.

* cited by examiner

N-TYPE MOSFET AND METHOD FOR MANUFACTURING THE SAME

CROSS-REFERENCE TO RELATED APPLICATIONS

This application claims priority to International Application No. PCT/CN2012/086127, filed on Dec. 7, 2012, entitled "N-TYPE MOSFET AND METHOD FOR MANUFACTURING THE SAME," and Chinese Application No. 201210505745.4, filed on Nov. 30, 2012, entitled "N-TYPE MOSFET AND ITS MANUFACTURING METHOD," which are incorporated herein by reference in their entirety.

BACKGROUND

Technological Field

The disclosed technology relates to the semiconductor technology, and particularly to N-type MOSFETs, including a metal gate layer and a high-k gate dielectric layer, and methods for manufacturing the same.

Description of the Related Technology

As semiconductor technology advances, Metal Oxide Semiconductor Field Effect Transistors (MOSFETs) feature sizes are decreasing. The decrease in size of the MOSFETs causes a significant problem of gate current leakage. The gate leakage current can be reduced by using a high-k gate dielectric layer, which may have an increased physical thickness with respect to a given equivalent oxide thickness (EOT). Unfortunately, a conventional Poly-Si gate is incompatible with the high-k gate dielectric layer. By using a combination of a metal gate layer and the high-k gate dielectric layer, it is possible not only to avoid the depletion effect of the Poly-Si gate and decrease gate resistance, but also to avoid boron penetration and enhance device reliability. Therefore, the combination of the metal gate layer and the high-k gate dielectric layer is widely used in the MOSFETs. However, integrating the metal gate layer and the high-k gate dielectric layer presents many challenges including thermal stability and interfacial states. In particular, it is difficult for MOSFETs using the metal gate layer and the high-k gate dielectric layer to have an adequately low threshold voltage due to the Fermi-Pinning Effect.

To obtain an appropriate threshold voltage, an N-type MOSFET should have its effective work function near the bottom of the conduction band of Si (about 4.1 eV). One approach is to select an appropriate combination of a metal gate layer and a high-K gate dielectric layer for the N-type MOSFET, so as to achieve the desired threshold voltage. However, it is difficult to obtain such a low effective work function simply by altering materials.

SUMMARY OF CERTAIN INVENTIVE ASPECTS

The disclosed technology provides, an improved N-type MOSFET and a method for manufacturing the same, by which it is possible to adjust an effective work function of the N-type MOSFET during manufacture thereof.

One aspect of the disclosed technology includes a method for manufacturing an N-type MOSFET. The method includes forming source/drain regions in a semiconductor substrate. The method also includes forming an interfacial oxide layer on the semiconductor substrate. The method also includes forming a high-k gate dielectric layer on the interfacial oxide layer. The method also includes forming a first metal gate layer on the high-k gate dielectric layer. The method also includes implanting dopants to the first metal gate layer through conformal doping. The method also includes annealing a gate stack to change an effective work function of the gate stack, the gate stack comprising the first metal gate layer, the high-k gate dielectric layer, and the interfacial oxide layer. In an embodiment, dopant for decreasing the effective work function is implanted to the first metal gate layer of the N-type MOSFET.

Another aspect of the disclosed technology includes an N-type MOSFET. The N-type MOSFET includes source/drain regions in a semiconductor substrate. The N-type MOSFET also includes an interfacial oxide layer on the semiconductor substrate. The N-type MOSFET also includes a high-k gate dielectric layer on the interfacial oxide layer. The N-type MOSFET also includes a first metal gate layer on the high-k gate dielectric layer. In some embodiments, dopants are distributed at an upper interface between the high-k gate dielectric layer and the first metal gate layer as well as at a lower interface between the high-k gate dielectric layer and the interfacial oxide layer, and generate electrical dipoles at the lower interface through an interfacial reaction, to change an effective work function of a gate stack comprising the first metal gate layer, the high-k gate dielectric layer, and the interfacial oxide layer.

In accordance with the disclosed technology, the dopants accumulated at the upper interface of the high-k gate dielectric can change characteristics of the metal gate, thereby adjusting the effective work function of the N-type MOSFET advantageously. On the other hand, the dopants accumulated at the lower interface of the high-k gate dielectric layer can generate the electrical dipoles of proper polarity through the interfacial reaction, thereby further adjusting the effective work function of the N-type MOSFET advantageously. The N-type MOSFET obtained by the method presents improves stability and the ability to adjust the effective work function of the metal gate.

BRIEF DESCRIPTION OF THE DRAWINGS

The foregoing and other objects, features, and advantages of the disclosed technology will become more apparent from the following description of embodiments when read in conjunction with the accompanying drawings, in which.

DETAILED DESCRIPTION OF CERTAIN ILLUSTRATIVE EMBODIMENTS

Next, the disclosed technology will be explained in detail with reference to the drawings. Similar components throughout the drawings are indicated by similar reference numbers. The drawings are not drawn to scale, for the sake of clarity. In the following description, some specific details are set forth, such as structures, materials, sizes, and treatment processes and technologies of devices, in order to provide a thorough understanding of the disclosed technology. However, it will be understood by those of ordinary skill in the art that the disclosed technology may be practiced without these specific details. Each portion of a semiconductor device may comprise materials well known to those of ordinary skill in the art, or materials having similar functions to be developed in future, unless noted otherwise. The terms "first", "second", "upper", and "lower" may be used in the present application for describing various structures of the device and various steps of the process. However, these words do not imply any spatial, sequential or hierarchy relation of various structures of the device and various steps of the process, unless the context clearly indicates otherwise In the following description, the term "semiconductor structure" refers to a semiconductor: substrate and all layers or regions formed on the semiconductor substrate obtained after some operations during a process of manufacturing a semiconductor device. The term "source/drain region" refers to either a source region or a drain region of a MOSFET, and both of the source region and the drain region are labeled with a single reference sign. The term "negative dopant" refers to a dopant applicable to an N-type MOSFET to reduce its effective work function.

A method for manufacturing an N-type MOSFET according to an embodiment of the disclosed technology will be illustrated with reference to FIGS. 1 to 11, which show section views of respective semiconductor structures at various stages of the method.

Figure 1:
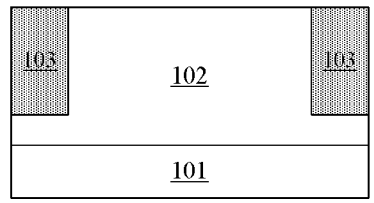
FIGS. 1 to 11 show cross-sectional views of semiconductor structures during stages of a method for manufacturing an N-type MOSFET device according to the disclosed technology.

FIG. 1 shows a semiconductor structure, which has gone through part of CMOS processes. Specifically, a P well 102 (P-type well 102) for an N-type MOSFET is formed to a depth in a semiconductor substrate 101 (e.g., a Si substrate). In FIG. 1, the P well 102 is shown in a rectangular shape. In practice, the P well 102 may not have a clear boundary, and may be isolated by a portion of the semiconductor substrate 101. A shallow trench isolation 103 defines an active region for the N-type MOSFET.

Figure 2:
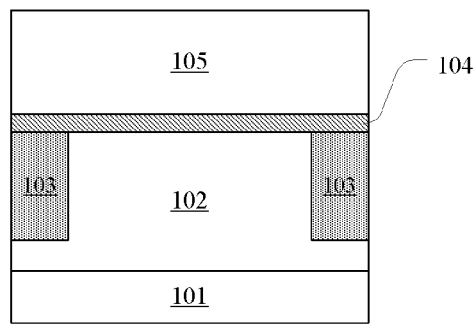

Then, a dummy gate dielectric layer 104 (e.g., silicon oxide, or silicon nitride) may be formed on the surface of the semiconductor structure through known deposition processes, such as Electron Beam Metal evaporation (EBM), Chemical Vapor Deposition (CVD), Atomic Layer Deposition (ALD), or sputtering. In an example, the dummy gate dielectric layer 104 is a layer of silicon oxide having a thickness of about 0.8-1.5 nm. A dummy gate conductor 105 (e.g., poly-silicon, or amorphous silicon (α-Si)) is further formed on a surface of the dummy gate dielectric layer 104 through any of the above deposition processes, as shown in FIG. 2.

Thereafter, a photoresist layer PR1 is formed on the dummy gate dielectric layer 104 through, for example, spin coating. The photoresist layer PR1 is patterned to define a shape (e.g., strip) of a gate stack through a photolithographic process including exposure and development.

Figure 3:
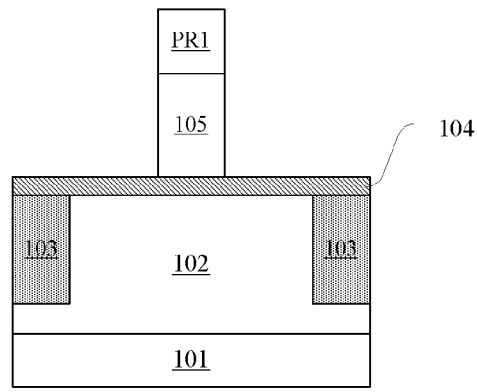

As shown in FIG. 3, exposed portions of the dummy gate conductor 105 are removed using the photoresist layer PR1 as a mask through dry etching (e.g., ion milling etching, plasma etching, reactive ion etching, or laser ablation) or wet etching using an etchant solution, to form a dummy gate conductor 105 for the N-type MOSFET, respectively. In the example of FIG. 3, the dummy gate conductor 105 of the N-type MOSFET is in the strip pattern, but the dummy gate conductor 105 may be in other shapes.

Next, the photoresist layer PR1 may be removed by dissolution in a solvent or ashing. The dummy gate conductor 105 is employed as a hard mask to implement ion implantation to form extension regions of the N-type MOSFET. In some embodiments, ion implantation may be further implemented to form halo regions for the N-type MOSFET.

A nitride layer may be formed on the surface of the semiconductor structure through any of the above deposition processes. In an embodiment, the nitride layer has a thickness of about 5-30 nm. A laterally-extending portion of the nitride layer is removed through anisotropic etching process (e.g., reactive ion etching), while vertical portions of the nitride layer on side surfaces of the dummy gate conductor 105 are left to form a gate spacer 106. As a result, the gate spacer 106 surrounds the dummy gate conductor 106.

Figure 4:
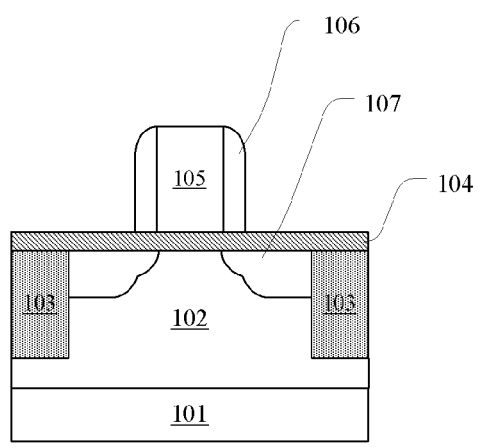

The dummy gate conductor 105 and the spacer 106 may be used as a hard mask to perform ion implantation, to form source/drain regions 107 for the N-type MOSFET, as shown in FIG. 4. After the source/drain ion implantation, spike annealing and/or laser annealing may be performed to activate implanted ions at a temperature of about 1000° C.-1100° C.

Figure 5:
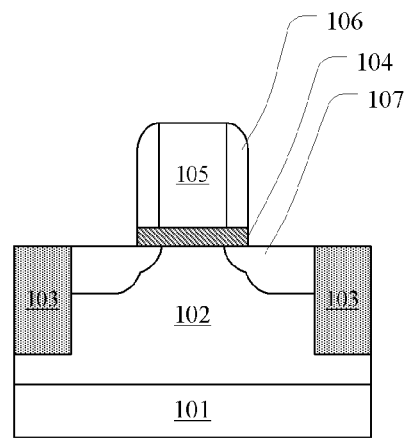

Next, by utilizing the dummy gate conductor 105 and the gate spacer 106 as a hard mask, exposed portions of the dummy gate dielectric layer 104 are selectively removed so as to expose a part of a surface of the P well 102, as shown in FIG. 5. As a result, the remaining portion of the dummy gate dielectric layer 104 is positioned below the dummy gate conductor 105.

Figure 6:
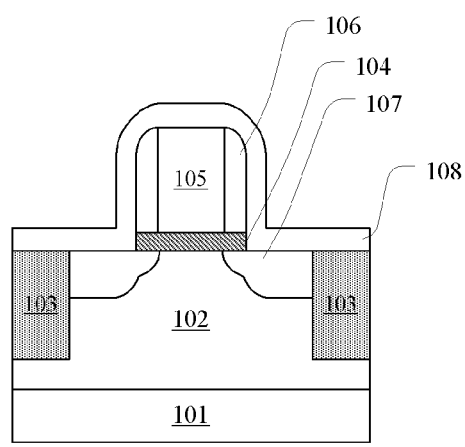

Then, a first insulating layer (e.g. silicon nitride) 108 is formed conformally on the surface of the semiconductor structure through any of the above deposition processes, as shown in FIG. 6. The first insulating layer 108 covers the dummy conductor 105 of the N-type MOSFET and the P well 102. In one example, the first insulating layer 108 is a silicon nitride layer with a thickness of about 5 nm-30 nm.

Figure 7:
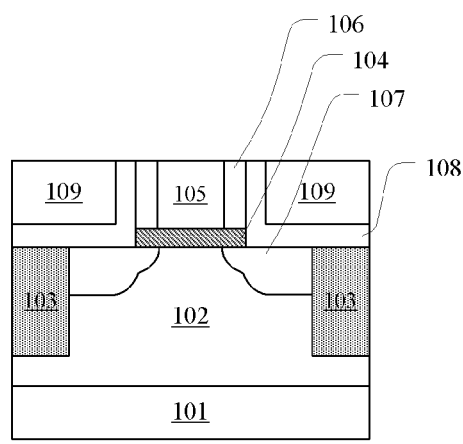

Next, a blanket second insulating layer (e.g. silicon oxide) 109 is formed on the surface of the semiconductor structure through any of the above deposition processes. The second insulating layer covers the first insulating layer 108 and fills an opening between the dummy gate conductor 105. Chemical-mechanical polishing (CMP) is implemented to planarize the surface of the semiconductor structure. The CMP removes portions of the first insulating layer 108 and the second insulating layer 109 on top of the dummy gate conductor 105, and may further remove portions of the dummy gate conductor 105 and the gate spacer 106. As a result, the semiconductor structure with a substantially flat surface is obtained and the dummy gate conductor 105 is exposed, as shown in FIG. 7. The first insulating layer 108 and the second insulating layer 109 together constitute an interlayer dielectric layer.

Figure 8:
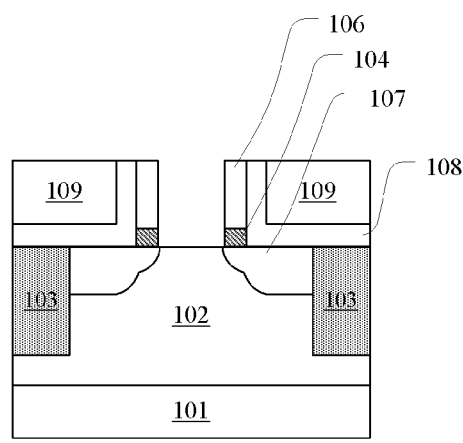

After that, the first insulating layer 108, the second insulating layer 109 and the gate spacer 106 are used as a hard mask to selectively remove the dummy gate conductor 105, and further remove the portion of the dummy gate dielectric layer 104 beneath the dummy gate conductor 105 through dry etching (e.g., ion milling etching, plasma etching, reactive ion etching, or laser ablation) or wet etching using an etchant solution, as shown in FIG. 8. In an example, the dummy gate conductor 105 is formed of poly-silicon, and thus removed through wet etching using a suitable etchant (e.g., Tetramethyl ammonium hydroxide, TMAH) solution. The etching process forms a gate opening which exposes a top surface of the P well 102 of the N-type MOSFET.

Next, an interfacial oxide layer 110 (e.g., silicon oxide) is formed on the exposed surface of the P well 102 of the N-type MOSFET through chemical oxidation or additional thermal oxidation. In an example, the interfacial oxide layer 110 is formed through a rapid thermal oxidation process at a temperature of about 600° C.-900° C. for about 20-120 s. In another example, the interfacial oxide layer 110 is formed by chemical oxidation in a solution containing ozone ($O_3$).

In some embodiments, before forming the interfacial oxide layer 110, the surface of the P well 102 of the N-type MOSFET is cleaned. The cleaning includes first conducting a conventional cleaning on the semiconductor structure, immersing the semiconductor structure in a mixture solution of hydrofluoric acid, isopropanol, and water, then rinsing the semiconductor structure with deionized water, and finally spin-drying the semiconductor structures. In some embodiments, the hydrofluoric acid, isopropanol, and water in the solution have a volume ratio of about 0.2-1.5%:0.01-0.10%:1, and the immersing is performed for about 1-10 minutes. With the cleaning process, the surface of the P well 102 of the N-type MOSFET can be cleaned, thereby suppressing natural oxidation and particle contamination on the silicon surface, and thus facilitating formation of the interfacial oxide layer 110 with high quality.

Figure 9:
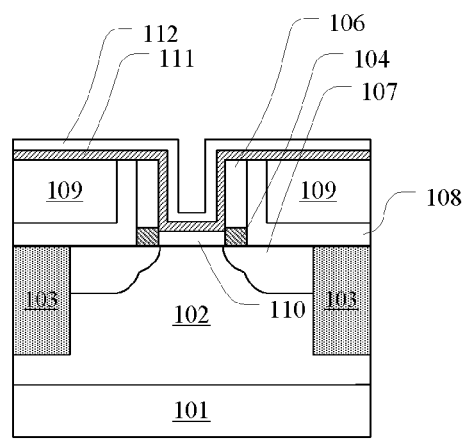

As shown in FIG. 9, a high-k gate dielectric layer 111 and a first metal gate layer 112 may be formed conformally in this order on the surface of the semiconductor structure through a known deposition process, such as ALD (Atomic Layer Deposition), CVD (Chemical Vapor Deposition), MOCVD (Metal Organic Chemical Vapor Deposition), PVD (Physical Vapor Deposition), or sputtering.

The high-k gate dielectric layer 111 may comprise a suitable material having a dielectric constant larger than that of $SiO_2$, such as any one selected from $ZrO_2$, ZrON, ZrSiON, HfZrO, HfZrON, HfON, $HfO_2$, HfAlO, HfAlON, HfSiO, HfSiON, HfLaO, HfLaON, or any of combinations thereof. The first metal gate layer 112 may comprise a suitable material that can be used to form a metal gate, such as any one selected from TiN, TaN, MoN, WN, TaC, or TaCN. In an example, the interfacial oxide layer 110 is, for example, a layer of silicon oxide with a thickness of about 0.2 nm-0.8 nm. The high-k gate dielectric layer 110 is, for example, a layer of $HfO_2$ with a thickness of about 2 nm-5 nm, and the first metal gate layer 112 is, for example, a layer of TiN with a thickness of about 1 nm-10 nm.

In some embodiments, post deposition annealing of the high-k gate dielectric layer may be included between forming the high-k gate dielectric layer 111 and forming the first metal gate layer 112, to improve the quality of the high-k gate dielectric layer. This may facilitate the subsequently-formed first metal gate layer 112 to have a uniform thickness. In an example, the post deposition annealing is rapid thermal annealing at a temperature of about 500° C.-1000° C. for about 5-100 s.

Figure 10:
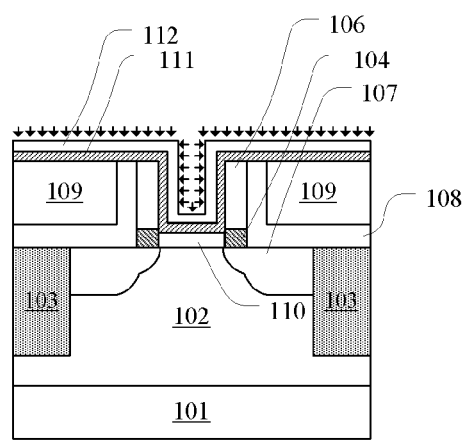

As shown in FIG. 10, negative dopants are implanted into the first metal gate layer 112 in the active region of the N-type MOSFET through conformal doping with the photoresist mask. The negative dopants may be selected from P, As, Sb, La, Er, Dy, Gd, Sc, Yb, or Tb. Energy and dose for the ion implantation may be controlled so that the implanted dopants are substantially only distributed in the first metal gate layer 112, without entering the high-k gate dielectric layer 111. The energy and dose for the ion implantation may be further controlled so that the first metal gate layer 112 has suitable doping depth and concentration in order to achieve an expected threshold voltage. In an example, the energy for the ion implantation may be about 0.2 KeV-30 KeV, and the dose may be about 1E13 $cm^{-2}$-1E15 $cm^2$ ($1\times10^{13}$ $cm^{-2}$-$1\times10^{15}$ $cm^{-2}$).

Figure 11:
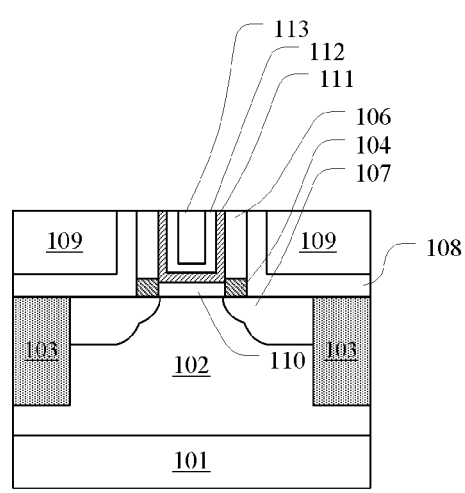

Then, a second metal gate layer 113 is formed on the surface of the semiconductor structure through a deposition process, such as any of the above known deposition processes. With the second insulating layer 109 as a stop layer, Chemical Mechanical Polishing (CMP) is performed to remove portions of the high-k gate dielectric layer 111, the first metal gate layer 112, and the second metal gate layer 113 outside the gate opening, while only portions thereof inside the gate opening are left, as shown in FIG. 11. The second metal gate layer may comprise a material identical to or different from that of the first metal gate layer, such as any one selected from W, TiN, TaN, MoN, WN, TaC, or TaCN. In an example, the second metal gate layer may be a layer of W about 2 nm-30 nm thick. As shown in the figures, a gate stack of the N-type MOSFET includes the second metal gate layer 113, the first metal gate layer 112, the high-k dielectric layer 111, and the interfacial oxide layer 110.

The above semiconductor structure may be subjected to annealing in an atmosphere of inert gas (e.g., $N_2$) or weak-reducibility gas (e.g., a mixture of $N_2$ and $H_2$) after the doping of the metal gate, for example, before or after forming the second metal gate layer 113. In an example, the annealing is conducted in an oven at a temperature of about 350° C.-700° C. for about 5-30 minutes. The annealing drives the implanted dopants to diffuse and accumulate at upper and lower interfaces of the high-k gate dielectric layer 111, and further generate electric dipoles through interfacial reaction at the lower interface of the high-k gate dielectric layer 111. Here, the upper interface of the high-k gate dielectric layer 111 denotes the interface with the overlying first metal gate layer 112, and the lower interface of the high-k gate dielectric layer 111 denotes the interface with the underlying interfacial oxide layer 110.

The annealing changes the distribution of the dopants. On one hand, the dopants accumulated at the upper interface of the high-k gate dielectric layer 111 can change characteristics of the metal gate, and thus facilitate adjustment of the effective function work of the N-type MOSFET. On the other hand, the dopants accumulated at the lower interface of the high-k gate dielectric layer 111 can generate electric dipoles of suitable polarity, and thus further facilitate adjustment of the effective function work of the N-type MOSFET. As a result, the effective work function of the gate stack of the N-type MOSFET can be changed in a range of about 4.1 eV to 4.5 eV.

Figure 12:
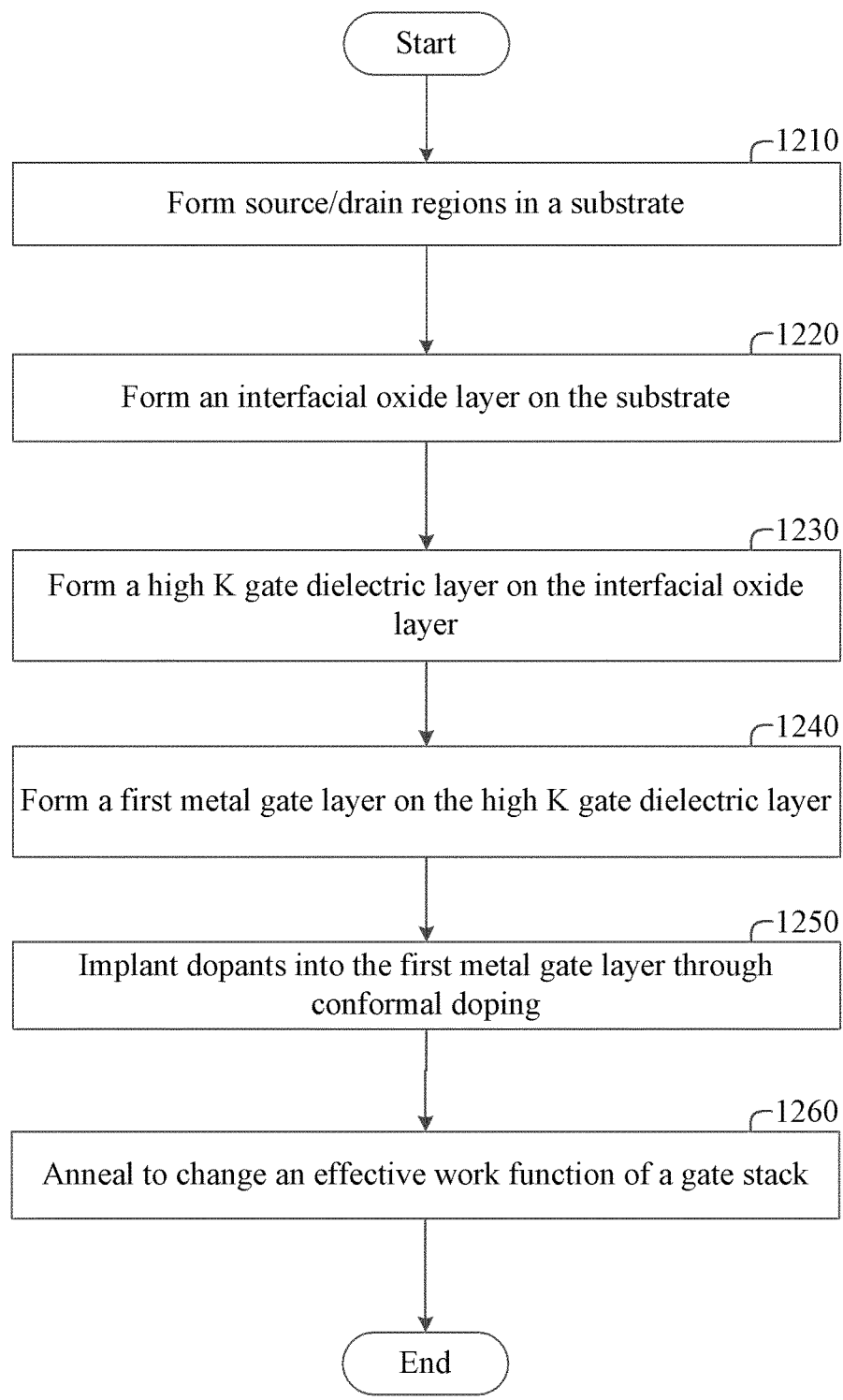
FIG. 12 is a flowchart illustrating a method for manufacturing an N-type MOSFET device according to the disclosed technology.

Manufacturing the semiconductor using the process flow depicted in FIGS. 1-11 will now be described with respect to FIG. 12, which is a flowchart illustrating a method 1200 of manufacturing an N-type MOSFET according to the disclosed invention. At block 1210, method 1200 forms source/drain regions 107 in a substrate 101. At block 1220, method 1200 forms an interfacial oxide layer 110 on the substrate 101. At block 1230, method 1200 forms a high-k gate dielectric layer 111 on the interfacial oxide layer 110. At block 1240, method 1200 forms a metal gate layer 112 on the high-k gate dielectric layer 111. At block 1250, method 1200 implants dopants into the first metal gate layer 112 through conformal doping. At block 1260, method 1200 anneals to change an effective work function of a gate stack, the gate stack comprising the first metal gate layer, the high-k gate dielectric, and the interfacial oxide layer.

The foregoing description does not illustrate every detail for manufacturing a MOSFET, such as formation of source/drain contacts, additional interlayer dielectric layers and conductive vias. Standard CMOS processes for forming these components are well known to those of ordinary skill in the art, and thus description thereof is omitted.

The present invention has been described above with reference to one or more embodiments thereof. It should be understood that various modifications, alternations and additions can be made to the device structure by one skilled person in the art without departing from the spirits and scope of the present invention. Moreover, the teachings of the present disclosure may make various modifications which may be adapted for particular situations or materials without departing from the spirits and scope of the present invention. Therefore, the object of the present invention is not limited to the above particular embodiments. The device structure and the manufacture method thereof as disclosed will include all of embodiments falling within the scope of the present invention.

What is claimed is:

1. A method of manufacturing an N-type MOSFET, comprising:
   forming source/drain regions in a semiconductor substrate;
   forming an interfacial oxide layer on the semiconductor substrate;
   forming a high-k gate dielectric layer on the interfacial oxide layer;
   forming a first metal gate layer on the high-k gate dielectric layer;
   implanting dopants into the first metal gate layer through conformal doping; and
   annealing a gate stack to change an effective work function of the gate stack, the gate stack comprising the first metal gate layer, the high-k gate dielectric, and the interfacial oxide layer,
   wherein one of the dopants is selected from a group consisting of P, As, Sb, and combinations thereof.

2. The method according to claim 1, wherein forming the source/drain regions comprises:
   forming a dummy gate stack on the semiconductor substrate, the dummy gate stack comprising a dummy gate conductor and a dummy gate dielectric between the dummy gate conductor and the semiconductor substrate;
   forming a gate spacer surrounding the dummy gate conductor; and
   forming the source/drain regions in the semiconductor substrate with the dummy gate conductor and the gate spacer as a hard mask.

3. The method according to claim 2, further comprising, after forming the source/drain regions and before forming the interfacial oxide layer:
   removing the dummy gate stack to form a gate opening that exposes a surface of the semiconductor substrate.

4. The method according to claim 3, further comprising, after implanting the dopants to the first metal gate layer and before annealing:
   forming a second metal gate layer on the first metal gate layer to fill the gate opening; and
   removing portions of the high-k gate dielectric layer, and the first and second metal gate layers outside the gate opening.

5. The method according to claim 4, wherein the second metal gate layer is formed of W, Ti, TiAl, Al, Mo, Ta, TiN, TaN, or WN.

6. The method according to claim 1, further comprising annealing, after forming the high-K gate dielectric and before forming the first metal gate layer, to improve quality of the high-K gate dielectric layer.

7. The method according to claim 1, wherein the first metal gate layer is formed of TiN, TaN, MoN, WN, TaC, or TaCN.

8. The method according to claim 1, wherein the first metal gate layer has a thickness of about 2 nm-10 nm.

9. The method according to claim 1, wherein the implanting is performed at an energy and a dose which are controlled so that the dopants are substantially only distributed in the first metal gate layer.

10. The method according to claim 9, wherein the energy is about 0.2 KeV-30 KeV.

11. The method according to claim 9, wherein the dose is about $1\times10^{13}$ cm$^{-2}$-$1\times10^{15}$ cm$^{-2}$.

12. The method according to claim 1, before forming the source/drain regions, further comprising:
    forming a P-type well in the semiconductor substrate, wherein the subsequently formed source/drain regions are located in the well.

13. The method according to claim 1, wherein the dopants implanted into the first metal gate layer comprise dopants configured to reduce the effective work function.

14. The method according to claim 1, wherein the annealing is performed in an atmosphere of inert gas or weak-reducibility gas at a temperature of about 350° C.-700° C. for about 5-30 minutes.

15. An N-type MOSFET, comprising:
    a plurality of source/drain regions in a semiconductor substrate;
    an interfacial oxide layer on the semiconductor substrate;
    a high-k gate dielectric layer on the interfacial oxide layer; and
    a first metal gate layer on the high-k gate dielectric layer, the first metal gate layer being evenly doped through conformal doping and annealing,
    wherein dopants are distributed at an upper interface between the high-k gate dielectric layer and the first metal gate layer as well as at a lower interface between the high-k gate dielectric layer and the interfacial oxide layer, and generate electrical dipoles at the lower interface through interfacial reaction, to change an effective work function of a gate stack comprising the first metal gate layer, the high-k gate dielectric layer, and the interfacial oxide layer, and wherein one of the dopants is selected from a group consisting of P, As, Sb, and combinations thereof.

16. The N-type MOSFET according to claim 15, further comprising:
    a second metal gate layer on the first metal gate layer; and
    a gate spacer surrounding the interfacial oxide layer, the high-k gate dielectric layer, and the first and second metal gate layers.

17. The N-type MOSFET according to claim 15, further comprising:
    a P-type well in the semiconductor substrate, wherein the source/drain regions are located in the well.

18. The N-type MOSFET according to claim 15, wherein the effective work function of the gate stack is in a range of 4.1 eV to 4.5 eV.

* * * * *

UNITED STATES PATENT AND TRADEMARK OFFICE
CERTIFICATE OF CORRECTION

PATENT NO. : 9,934,975 B2
APPLICATION NO. : 14/494447
DATED : April 3, 2018
INVENTOR(S) : Huilong Zhu et al.

Page 1 of 1

It is certified that error appears in the above-identified patent and that said Letters Patent is hereby corrected as shown below:

In the Specification

In Column 3 at Line 8, After "otherwise" insert --.--.

In Column 5 at Line 58, Change "$cm^2$" to --$cm^{-2}$--.

Signed and Sealed this
Fourteenth Day of August, 2018

Andrei Iancu
*Director of the United States Patent and Trademark Office*